United States Patent
Rha et al.

(10) Patent No.: US 6,613,670 B2
(45) Date of Patent: *Sep. 2, 2003

(54) METHOD FOR FORMING TUNGSTEN BIT LINE AND DEVICES INCLUDING THE SAME

(75) Inventors: Sa Kyun Rha, Seoul (KR); Jeong Eui Hong, Chungcheongbuk-do (KR); Young Jun Lee, Chungcheongbuk-do (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/443,189

(22) Filed: Nov. 18, 1999

(65) Prior Publication Data

US 2002/0037644 A1 Mar. 28, 2002

(30) Foreign Application Priority Data

Nov. 24, 1998 (KR) .............................. 98-50439

(51) Int. Cl.$^7$ .............................................. H01L 21/44
(52) U.S. Cl. .................. 438/657; 438/621; 438/629; 438/643; 438/659; 438/675
(58) Field of Search .................. 438/656, 657, 438/675, 637, 653, 655, 629, 630, 659, 649, 683, 597, 643, 663; 257/412, 413

(56) References Cited

U.S. PATENT DOCUMENTS

| | | | |
|---|---|---|---|
| 4,873,664 A | 10/1989 | Eaton, Jr. | |
| 5,094,981 A | * 3/1992 | Chung et al. | 438/621 |
| 5,680,344 A | 10/1997 | Seyyedy | |
| 5,781,495 A | 7/1998 | Arimoto | |
| 5,858,868 A | * 1/1999 | Hirade | 438/597 |
| 5,915,204 A | * 6/1999 | Sumi | 438/683 |
| 6,198,143 B1 | * 3/2001 | Ohsaki | 257/412 |

OTHER PUBLICATIONS

K.N. Kim et al, 1998 Symposium on VLSI Technology Digest of Technical Papers, pp. 16–17.
K.N. Kim et al, 1997 Symposium on VLSI Technology Digest of Technical Papers, pp. 9–10.
Kaustav Banerjee et al, "Temperature and Current Effects on Small–Geometry—Contact Resistance", 1997 IEEE, pp. 5.5.1–5.5.4.

* cited by examiner

*Primary Examiner*—Phat X. Cao
*Assistant Examiner*—Theresa T. Doan
(74) *Attorney, Agent, or Firm*—Birch, Stewart, Kolasch & Birch, LLP (57) ABSTRACT

The method of the present invention includes providing a silicon substrate having an impurity region, forming an inter-layer insulating film having a contact hole in the impurity region and forming a titanium film and titanium nitride film in the contact hole. The method of the present invention further includes conducting a heat treatment to cause a reaction between the titanium film and the silicon substrate and forming a tungsten plug on the titanium nitride film in the contact hole. The device of the present invention including the bit lines are made up of a first inter-layer insulating film on the substrate having a first contact hole over the impurity region, a titanium film in the first contact hole, a titanium nitride film on the titanium film, a titanium silicide film on the silicon substrate wherein the titanium silicide film does not include an agglomerate, a tungsten plug on the titanium nitride film in the first contact hole and a circuit element on the first inter-layer insulating film.

24 Claims, 13 Drawing Sheets

FIG.9 agglomeration

METHOD FOR FORMING TUNGSTEN BIT LINE AND DEVICES INCLUDING THE SAME

BACKGROUND OF THE INVENTION

1. Field of the Invention

The present invention relates to a method for forming a bit line in a semiconductor device, and more particularly, to a method for forming a tungsten bit line. The present invention also relates to devices that include these bit lines.

2. Background of the Related Art

In general, as a semiconductor device, such as a DRAM and the like, is packed highly, a bit line of doped polysilicon or a stack of tungsten silicide ($WSi_x$)/polysilicon is used. However, when such a bit line is used, an operation speed drop occurs due to the high resistivity of the bit line. Further, when the bit line consists of doped polysilicon, the doping type of the polysilicon used for the bit line is changed according to the doping type of the silicon substrate which is in contact with the bit line. To prevent the doping type change of the doped polysilicon, contact with the silicon substrate is made through an additional metal, complicating the fabrication process and increasing the device size. Accordingly, to solve this problem, there has recently been research on using tungsten (resistivity of approx. 10–15 $\mu\Omega cm$), which has a resistivity significantly lower than tungsten silicide $WSi_x$ (resistivity of approx. 80–90 $\mu\Omega cm$). However, because a titanium layer, used as a contact layer to a tungsten bit line, reacts with the silicon substrate to form a titanium silicide $TiSi_x$ layer which is subsequently agglomerated during a high temperature heat treatment conducted in forming a capacitor, the tungsten bit line has the problems of high contact resistance or junction leakage.

In the case of a trench-capacitor-type-DRAM, where the capacitor is formed before the bit line, a heat treatment at a temperature over 600° C. is not required in fabrication processes performed after the bit line is formed. However, in the case of a DRAM, where the capacitor is formed after the bit line, because the heat treatment is carried out at a temperature over 600° C. in forming a capacitor, the heat treatment causes a reaction between the titanium layer Ti, used as a contact layer to the tungsten bit line, and the silicon in the silicon substrate to form a titanium silicide layer $TiSi_x$. The $TiSi_x$ layer is subsequently agglomerated, resulting in a reduction of contact size, an increase of contact resistance, or a breakage of contact of the source/drain junction.

A related art method for forming a bit line on a stack of tungsten silicide/polysilicon or of tungsten after forming a field oxide, a well, a gate line, an n-type and p-type source/drain impurity regions, and an ILD (inter-layer dielectric) layer will be explained with reference to the attached drawings. FIGS. 1A–1D illustrate the steps of a related art method for forming a bit line consisting of a stack of tungsten silicide/polysilicon.

Figure 1A:
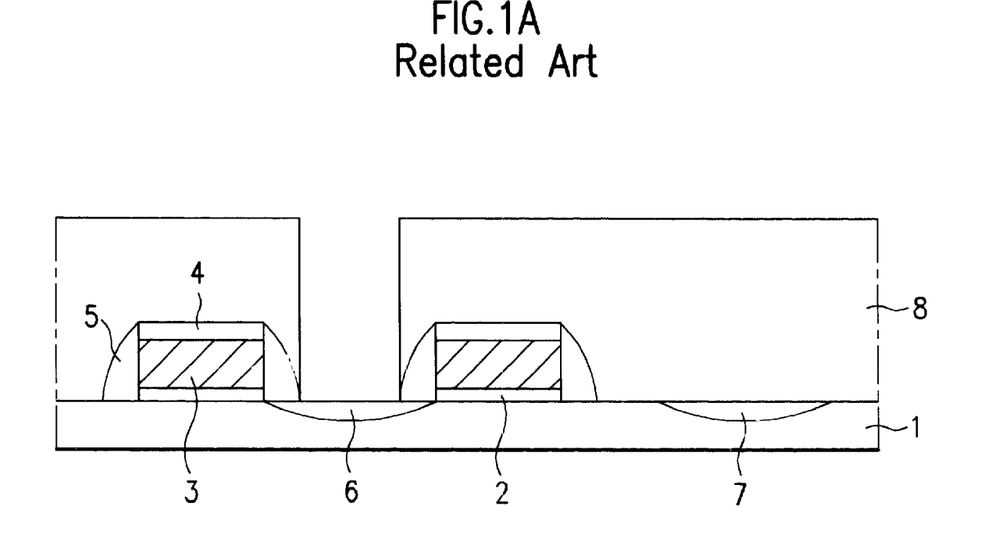
FIGS. 1A~1D illustrate the steps of a related art method for forming a bit line consisting of a stack of tungsten silicide/polysilicon.

Referring to FIG. 1A, a field oxide film (not shown), a gate insulating film 2, a gate line 3 consisting of a stack of polysilicon and tungsten silicide, a cap gate insulating film 4, sidewall insulating films 5, and cell and peripheral source/drain impurity regions 6 and 7, respectively, are formed on a silicon substrate 1. Here, the cell source/drain impurity region 6, in the cell region, is of n-type, and the peripheral source/drain impurity region 7, in a peripheral region, is of p-type. Then, a first inter-layer insulating film 8 is formed on the substrate 1 and subjected to photo-etching to remove the first inter-layer insulating film 8 selectively over the cell source/drain impurity region 6 and to form a bit line contact hole to the cell source/drain impurity region 6. Though not shown in the drawing, the photoresist used in the photo-etching is removed, and cleaning and washing for removing a natural oxide film is carried out.

Figure 1B:
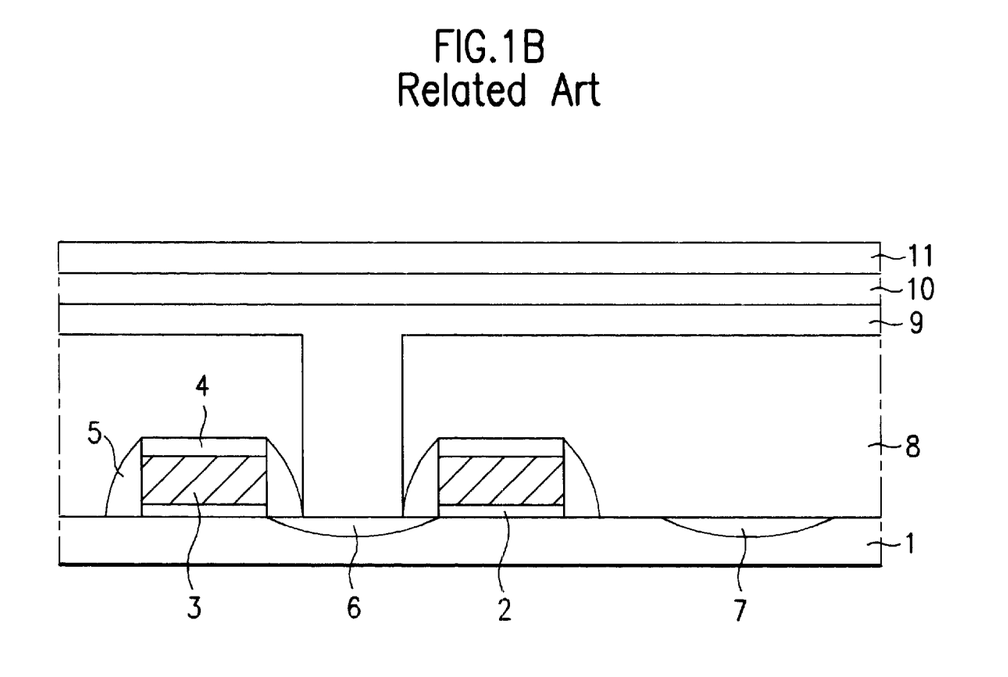

As shown in FIG. 1B, polysilicon 9 is deposited over the entire surface so as to fill the bit line contact hole, and is etched back, leaving the deposited polysilicon in the contact hole. In some cases, polysilicon is deposited thereon, again. A tungsten silicide layer 10 and an oxide film 11 are deposited in succession on the polysilicon 9. Optionally, the oxide film 11, deposited for capping the tungsten silicide layer 10, may not be deposited.

Figure 1C:
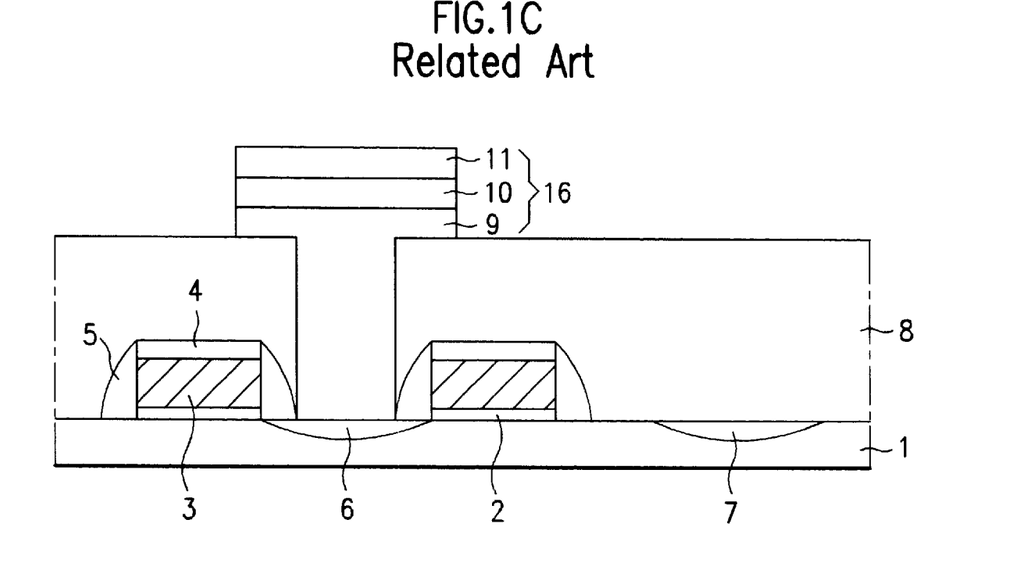

As shown in FIG. 1C, photo-etching is conducted to remove the oxide film 11, the tungsten silicide layer 10, and the polysilicon layer 9 selectively and to form a bit line 16.

Figure 1D:
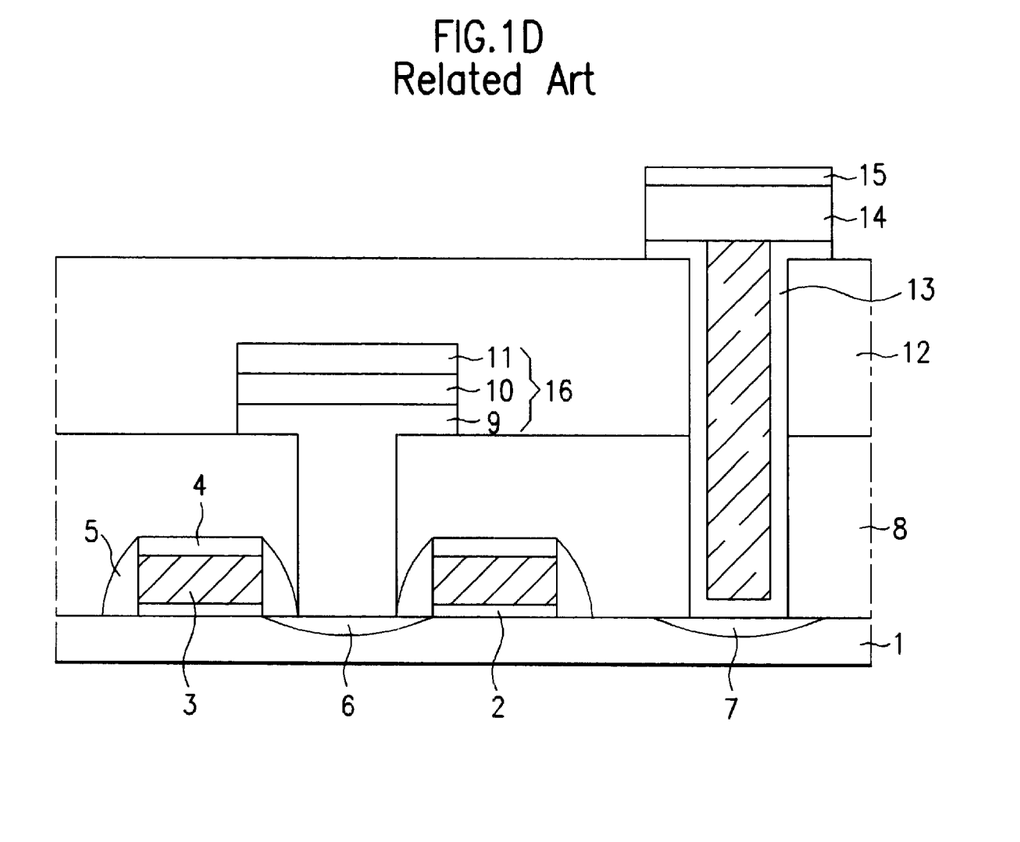

As shown in FIG. 1D, a second inter-layer insulating film 12 is deposited on the entire surface for electrical discontinuation of the bit line from other lines. The second inter-layer insulting film 12 over the peripheral source/drain impurity region 7 is selectively removed to form a contact hole. A metal contact layer and a TiN/Ti barrier layer 13 is formed on the entire surface, and a metal layer 14 and a cap insulting film 15 are formed in succession and subjected to photo-etching to pattern a signal line.

A second related art method, for forming a bit line of tungsten, will be explained. FIGS. 2A–2E illustrate the steps of a related art method for forming a bit line of tungsten.

Figure 2A:
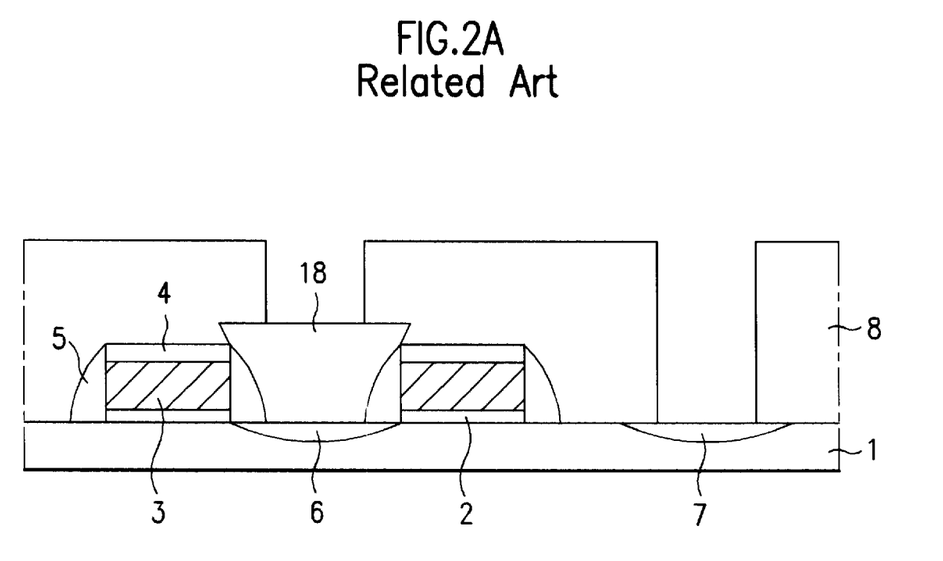
FIGS. 2A~2E illustrate the steps of a related art method for forming a bit line of tungsten.

Referring to FIG. 2A, a field oxide film (not shown), a gate insulting film 2, a gate line 3 consisting of a stack of polysilicon and tungsten silicide, a cap gate insulating film 4, sidewall insulating films 5, and cell and peripheral source/drain impurity regions 6 and 7 are formed on a silicon substrate 1. The cell source/drain impurity region 6 is of n-type, and the peripheral source/drain impurity region 7 is of p-type. Doped polysilicon 18 is then deposited for use as a contact plug and selectively removed to leave it only on the cell source/drain impurity region 6. Then, a first inter-layer insulating film 8 is formed on the entire surface for electrical discontinuation between tungsten bit lines and is then subjected to photo-etching to form contact holes over the doped polysilicon layer 18 and over the peripheral source/drain impurity region 7.

Figure 2B:
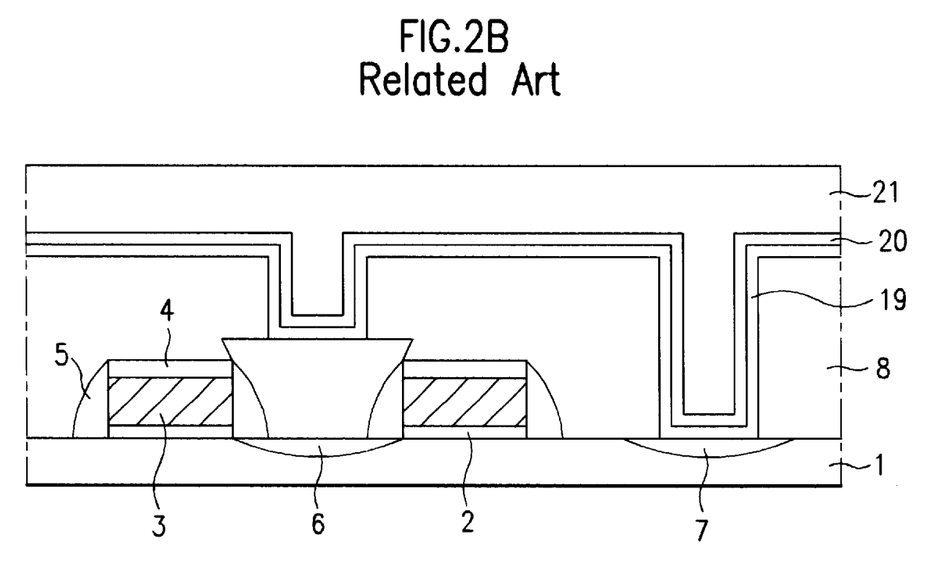

As shown in FIG. 2B, a thin titanium layer 19 is formed on the entire surface for use as a contact layer to a tungsten bit line. A titanium nitride film 20 is formed on the titanium layer 19 for use as a diffusion barrier layer to the tungsten bit line and a heat treatment is conducted in an RTP (Rapid Thermal Process) device or in a furnace to cause a reaction between the titanium layer 19 and the silicon substrate 1, forming a titanium silicide $TiSi_x$ layer (not shown in FIG. 2B, but shown in FIG. 3 as reference numeral 22). The heat treatment is conducted at 600–750° C. for 10–120 seconds if the RTP device is used and at 550–650° C. for 1–60 minutes if the furnace is used. Then, a tungsten layer 21 is deposited on the entire surface.

Figure 2C:
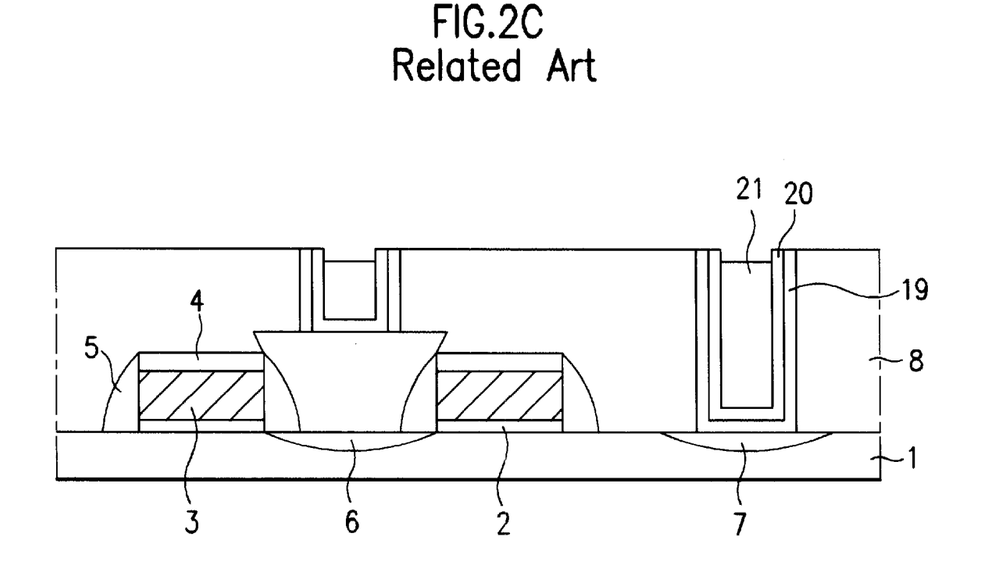

As shown in FIG. 2C, an etch back is carried out to pattern the tungsten layer 21 and to leave the tungsten layer 21 only in the contact hole. The etch back may be a dry etching or may use a CMP (Chemical Mechanical Polishing) device.

Figure 2D:
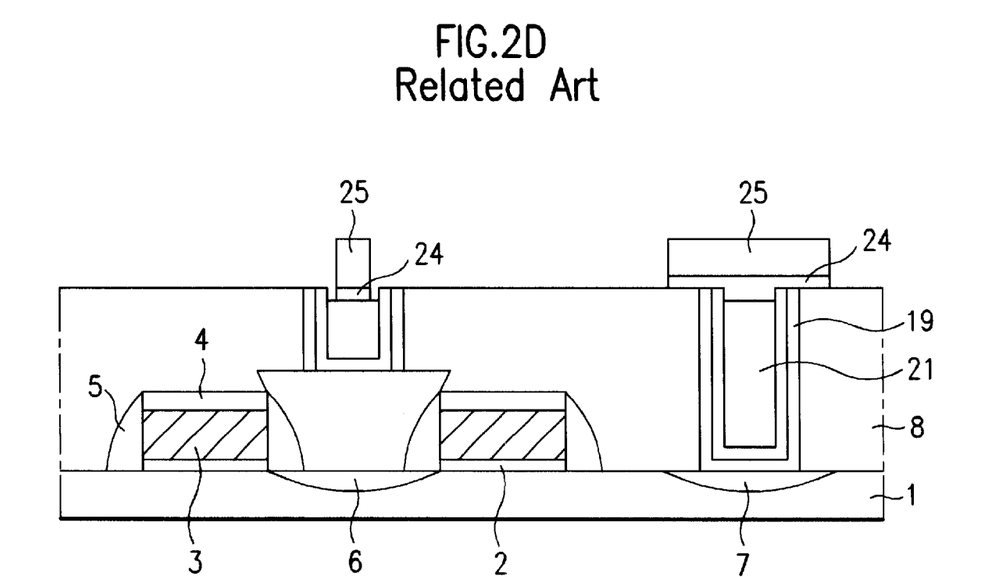

As shown in FIG. 2D, a barrier layer 24 and a tungsten layer 25 are deposited again and patterned to form the tungsten bit line.

Figure 2E:
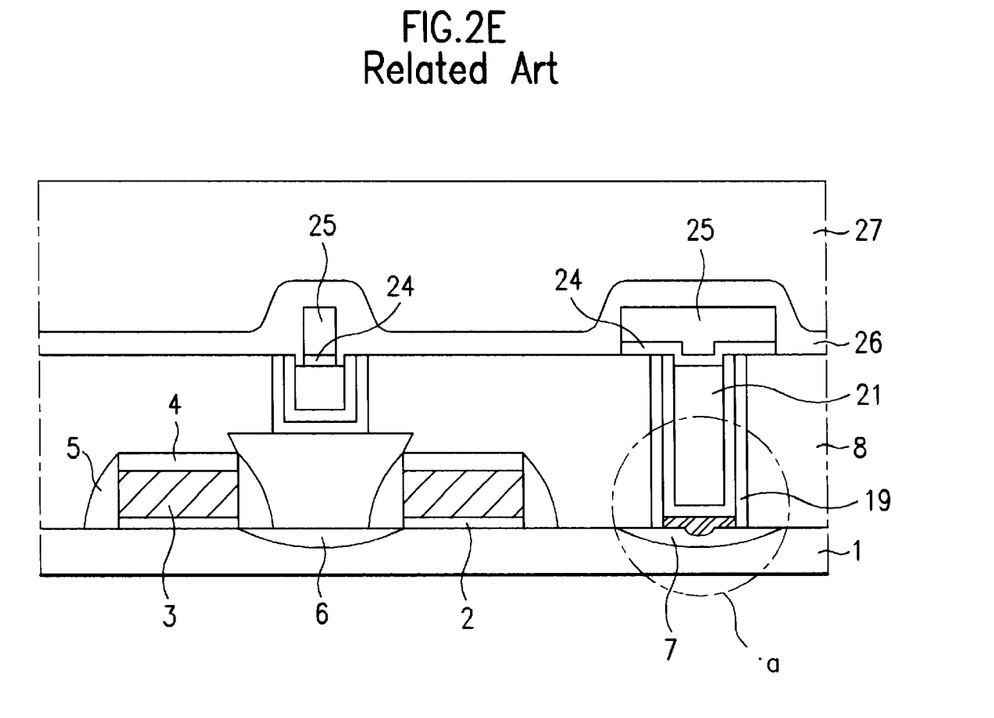

As shown in FIG. 2E, a nitride film 26 is deposited on the entire surface, serving as a cap on the tungsten bit line, and an oxide film 27 is formed on the nitride film 26. Though not shown, a capacitor is formed on the oxide film 27 at a temperature higher than 600° C.

The related art method for forming a bit line has the following problems: First, the bit line of doped polysilicon or a stack of tungsten silicide/polysilicon results in slow operation speed due to a high resistance of the doped polysilicon or tungsten silicide/polysilicon layer. Second, in the case of CMOS, the doping type of the doped polysilicon used for the bit line is changed according to the doping type of the region of the silicon substrate with which the bit line is in contact. Also, the metal plug formed for solving this problem complicates the fabrication process and results in a device of large size.

Third, because a heat treatment at a temperature higher than 600° C. is carried out for forming a capacitor after formation of the bit line, when using tungsten with a low resistivity as the bit line, a reaction between the contact layer of titanium and the silicon substrate occurs to form a titanium silicide $TiSi_x$ layer. This layer agglomerates, later resulting in a reduction of contact size, an increased contact resistance and a junction leakage coming from junction breakage at the source/drain in the region of the agglomerated titanium silicide $TiSi_x$.

Figure 3:
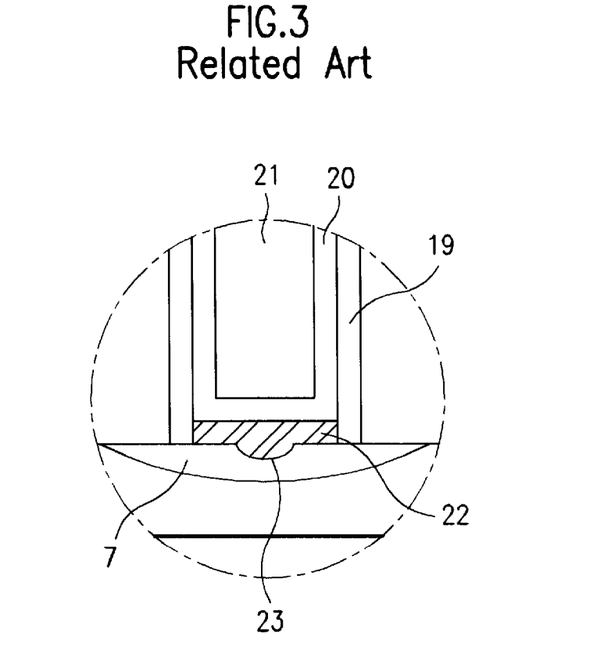
FIG. 3 illustrates a detailed section of a contact portion after formation of a related art bit line and subsequent heat treatment.

FIG. 3 illustrates a detailed section of a source/drain contact portion after the formation of a related art bit line and subsequent heat treatment. As shown in FIG. 2B, titanium is deposited and heat-treated to form a titanium silicide in the contact portion. However, as shown in FIG. 3, as the capacitor is formed at a temperature higher than 600° C., the titanium silicide layer 22 becomes an agglomerate 23. This agglomerate 23 causes not only the contact resistance to increase but also causes junction leakage because the agglomerated titanium silicide $TiSi_x$ layer breaks the source/drain junction at the location of the agglomerated titanium silicide $TiSi_x$ layer.

SUMMARY OF THE INVENTION

Accordingly, the present invention is directed to a method for forming a bit line that substantially obviates one or more of the problems due to limitations and disadvantages of the related art.

An object of the present invention is to provide a method for forming a bit line in which an agglomeration of metal silicide is inhibited, reducing the bit line contact resistance and improving diffusion barrier layer performance, thereby reducing junction leakage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as in the appended drawings.

To achieve these and other advantages and in accordance with the purpose of the present invention, as embodied and broadly described, the method for forming a tungsten bit line includes the steps of providing a silicon substrate having an impurity region, forming an inter-layer insulating film having a contact hole over the impurity region, forming a titanium film and titanium nitride film in the contact hole, conducting a heat treatment to cause a reaction between the titanium film and the silicon substrate to forms a titanium silicide having a C54 structure, and forming a tungsten plug on the titanium nitride film in the contact hole.

To further achieve these and other advantages and in accordance with the purpose of the present invention, as embodied and broadly described, the devices including the bit lines are made up of a first inter-layer insulating film on the substrate having a first contact hole over the impurity region, a titanium film in the first contact hole, a titanium nitride film on the titanium film, a titanium silicide film on the silicon substrate wherein the titanium silicide film does not include an agglomerate, a tungsten plug on the titanium nitride film in the first contact hole and a circuit element on the first inter-layer insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, wherein like reference numerals represent like components, and, together with the description, serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 4A~4E illustrate the steps of a method for forming a bit line in accordance with a first preferred embodiment of the present invention. FIG. 5 illustrates a detailed section of a contact portion after formation of the bit line of tungsten according to the first embodiment of the present invention and subsequent heat treatment.

The first embodiment method for forming a bit line of the present invention is the same as the related art method illustrated in FIGS. 2A~2E except for the heat treatment condition and an additional ion injection into the source/drain impurity region at the contact portion.

Figure 4A:
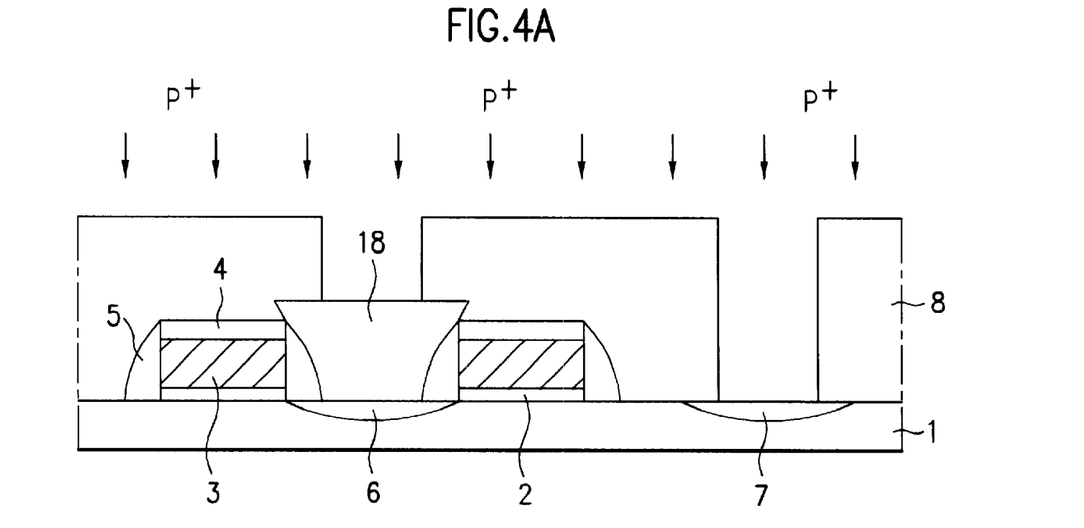
FIGS. 4A~4E illustrate the steps of a method for forming a bit line in accordance with a first preferred embodiment of the present invention.
Figure 5:
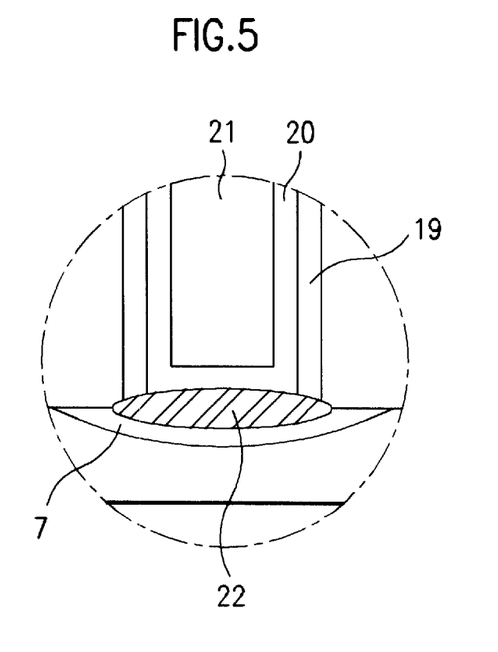
FIG. 5 illustrates a detailed section of a contact portion after formation of the first embodiment bit line of tungsten of the present invention and subsequent heat treatment.

That is, referring to FIG. 4A, a field oxide film (not shown), a gate insulting film 2, a gate line 3 consisting of a stack of polysilicon and tungsten silicide, a cap gate insulating film 4, sidewall insulating films 5, and cell and peripheral source/drain impurity regions 6 and 7 are formed on a silicon substrate 1. The cell source/drain impurity region 6 is of n-type, and the peripheral source/drain impurity region 7 is of p-type. The peripheral source/drain impurity region 7 may be of either n-type or a p-type but the p-type has been selected in this embodiment. Then, doped polysilicon 18 is deposited for use as a contact plug and selectively removed to leave doped polysilicon 18 only on the cell source/drain impurity region 6.

Next, a first inter-layer insulating film 8 is formed on the entire surface for electrical discontinuation between tungsten bit lines and is subjected to photo-etching to form contact holes on the doped polysilicon layer 18 and on the peripheral source/drain impurity region 7. In this instance, in order to provide for an out-diffusion of p$^+$ ions from the p-type impurity region in a later fabrication process, p-type impurity ion injection into the p-type peripheral source/drain impurity region 7 is carried out.

Figure 4B:
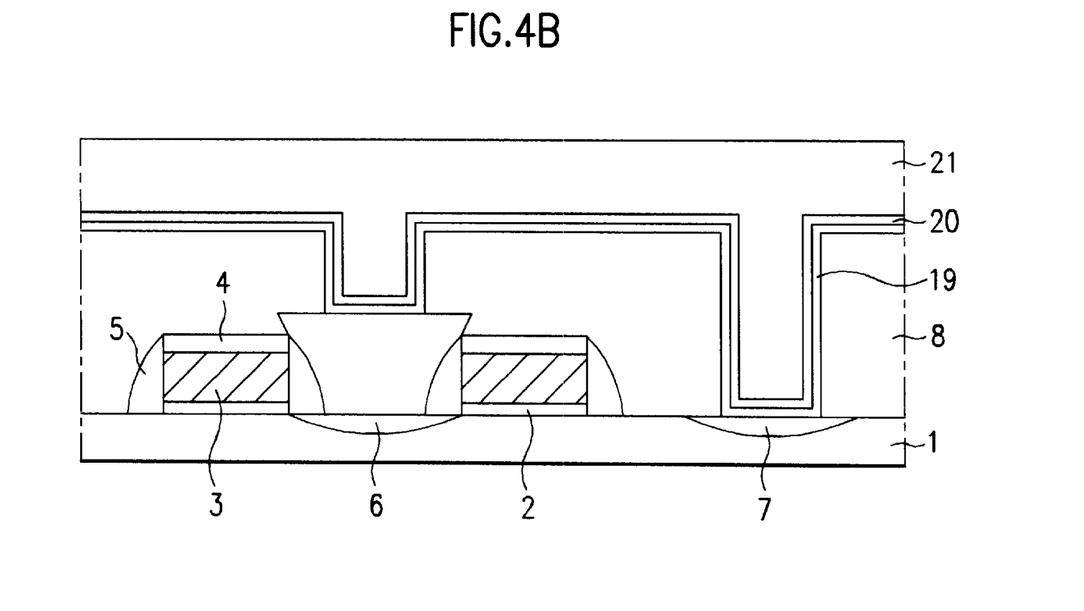

As shown in FIG. 4B, a thin titanium layer 19 is formed on the entire surface for use as a contact layer to a tungsten bit line, a titanium nitride film 20 is formed on the titanium layer 19 for use as a diffusion barrier layer to the tungsten bit line and a heat treatment is conducted in an RTP device or in a furnace to cause a reaction between the titanium layer 19 and the silicon substrate 1. The reaction forms a titanium silicide TiSi$_x$ layer having a C54 structure (not shown in FIG. 4B, but shown in FIG. 5 as reference numeral 22). The heat treatment is conducted at 750~950° C. for 1~120 seconds if the RTP device is used and at 650~850° C. for 0.3~60 minutes if the furnace is used. Then, a titanium nitride film is deposited once more for use as a diffusion barrier and a tungsten layer 21 is deposited on the entire surface.

Figure 4C:
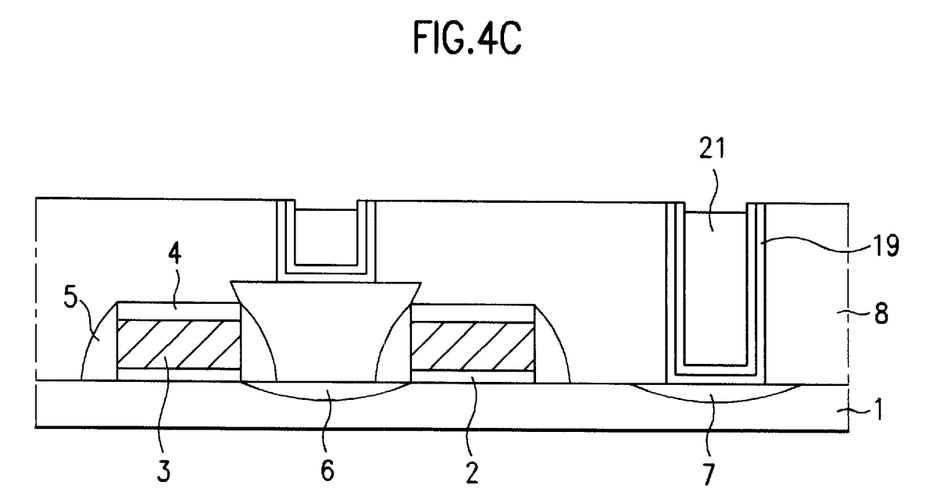

As shown in FIG. 4C, an etch back is carried out to pattern the tungsten layer 21, leaving the tungsten layer only in the contact holes. The etch back may be a dry etching or a CMP device may be used.

Figure 4D:
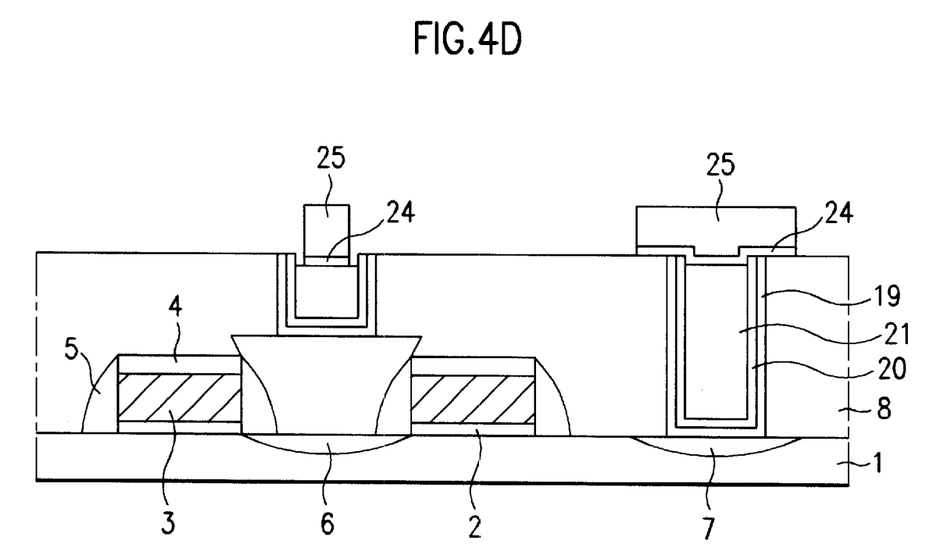

As shown in FIG. 4D, a barrier layer 24 and a tungsten layer 25 are deposited a second time and patterned to form the tungsten bit line.

Figure 4E:
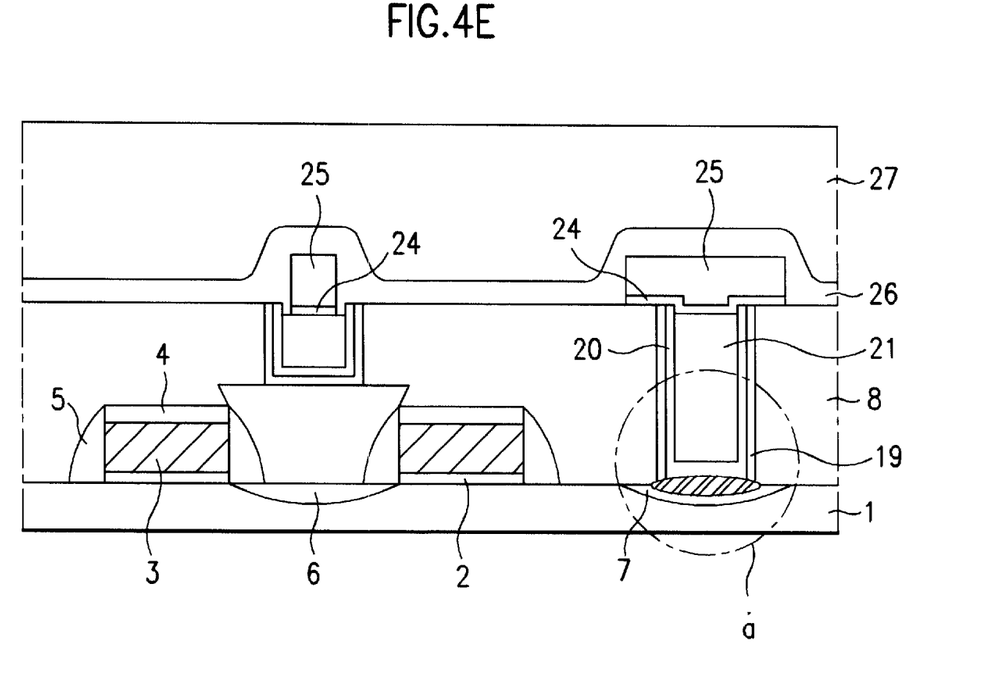

As shown in FIG. 4E, a nitride film 26 is deposited on the entire surface to serve as a cap on the tungsten bit line and an oxide film 27 is formed on the nitride film 26. Though not shown, a capacitor is formed on the oxide film 27 at a temperature higher than 600° C.

A method for forming a bit line in accordance with a second preferred embodiment of the present invention will now be explained. The second embodiment is identical to the first embodiment up to the step of forming the tungsten layer 21 plug. That is, steps from 6A to 6C are equivalent to the steps 4A to 4C. Accordingly, the second embodiment of the present invention will be explained starting from FIG. 6D.

Figure 6A:
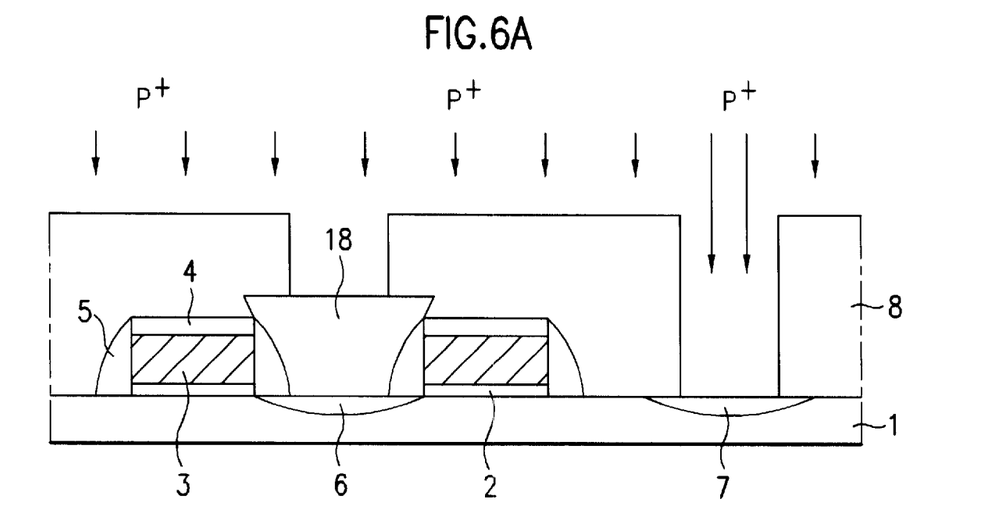
FIGS. 6A~6E illustrate the steps of a method for forming a bit line in accordance with a second preferred embodiment of the present invention.
Figure 6B:
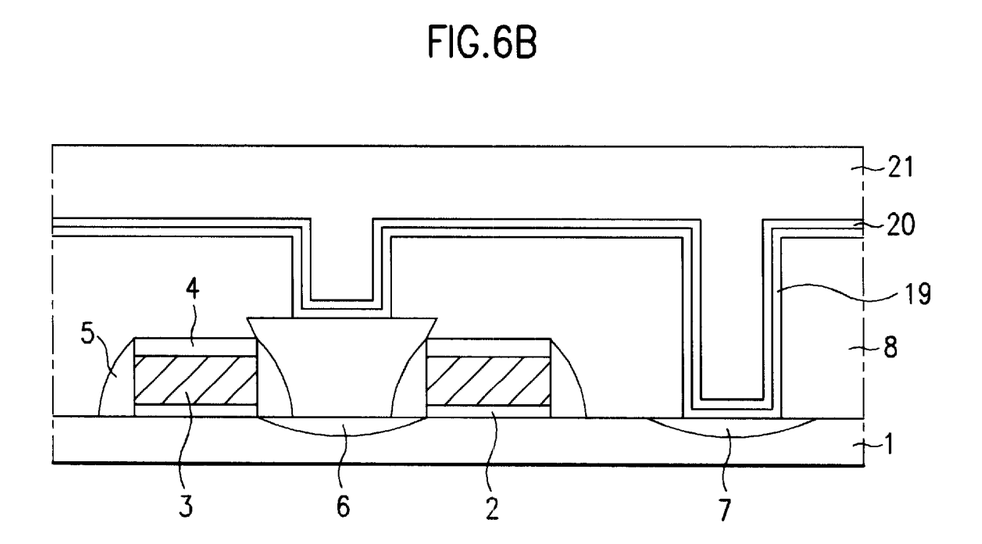
Figure 6C:
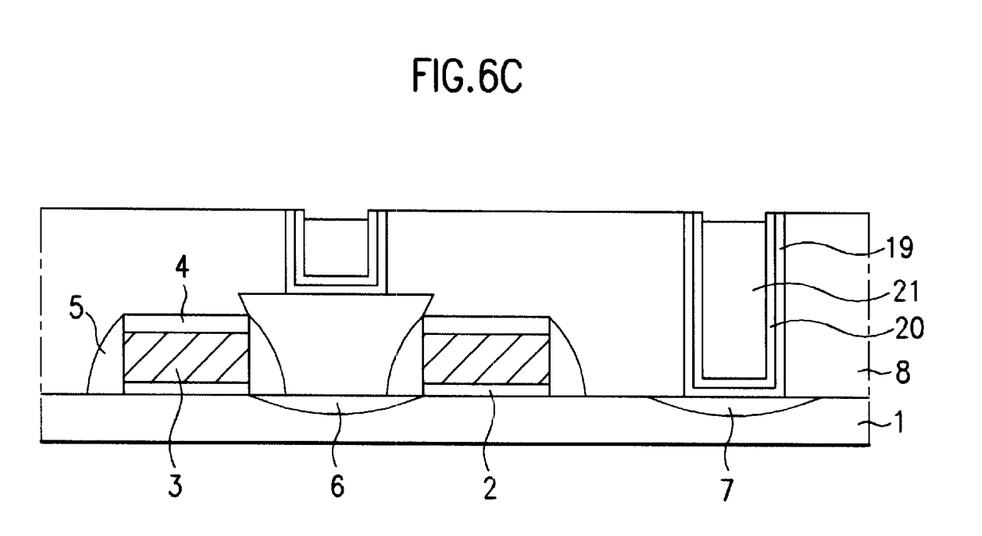
Figure 6D:
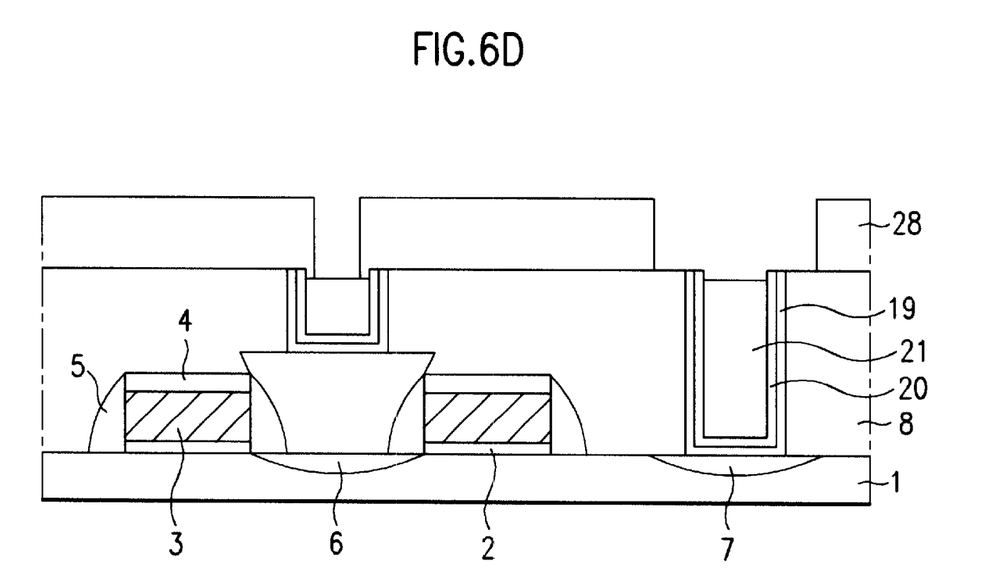

Referring to FIG. 6D, a second inter-layer insulating film 28 is deposited and selectively removed to form a contact hole over the portion where the tungsten plug 21 is formed.

Figure 6E:
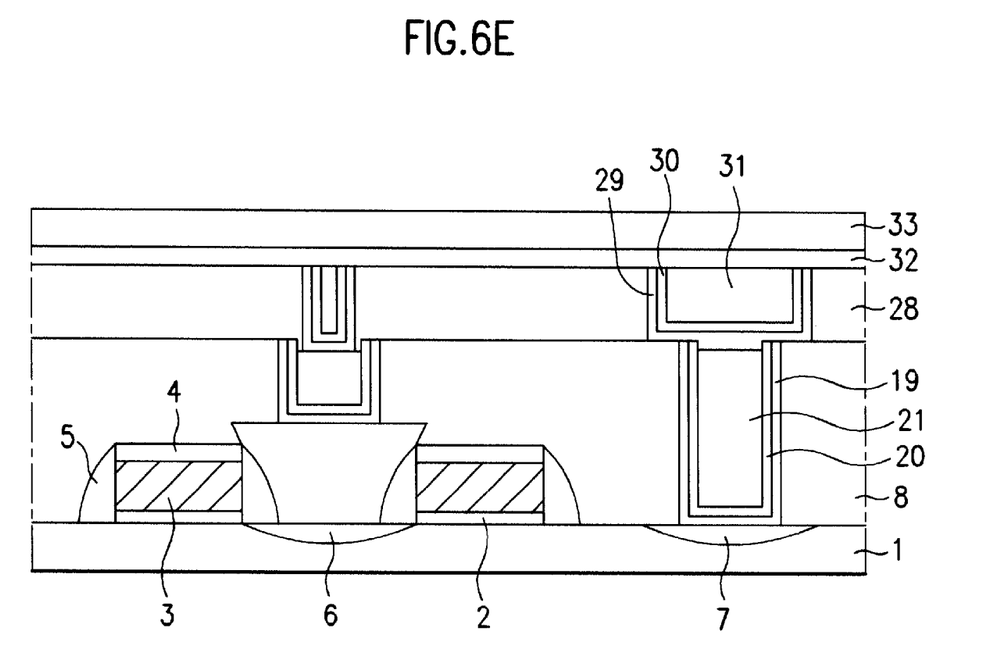

As shown in FIG. 6E, thin films of titanium 29 and titanium nitride 30 are deposited on the entire surface and tungsten 31 is deposited thereon so as to fill the contact hole. Then, the titanium 29 and titanium nitride 30 and the tungsten 31 are subjected to etch back or CMP to remove the titanium 29 and titanium nitride 30 and the tungsten 31, leaving titanium 29 and titanium nitride 30 and tungsten 31 only in the-contact hole, to form a bit line. Optionally, though not illustrated in FIG. 6E, the thin films of titanium 29 and titanium nitride 30 illustrated in FIG. 6E can be replaced with a single film of titanium nitride.

A nitride film 32, for use as a bit line cap, and a planarizing oxide film 33 are deposited in succession on the entire surface. Then, though not shown in the drawing, a capacitor is formed on the oxide film 33 at a temperature over 600° C.

FIG. 5 illustrates the contact region between the titanium layer 19 and the peripheral source/drain impurity region 7 of the silicon substrate. As can be seen from FIG. 5, formation of a titanium silicide layer 22 occurs in a region in which the bit line is in contact with the silicon substrate. This formation is due to the heat treating at a high temperature and will be contrasted with a following capacitor-formation process wherein the heat treatment is carried out at a lower temperature and prevents the agglomeration of the titanium silicide.

First, the use of a tungsten layer with a low resistivity (10~15 $\mu\Omega$cm) as the bit line can improve the device operation speed in comparison to the case when the doped polysilicon layer or tungsten silicide/polysilicon (resistivity: 80~100 $\mu\Omega$cm) layer is used as the bit line in the related art.

Second, the problem of the related art wherein a change in the doping type of the region of the silicon substrate with which the bit line is in contact or the metal plug is formed is eliminated. This problem is encountered in the related art when using a polysilicon layer or a tungsten silicide/polysilicon layer as the bit line. In the case of a CMOS, the doping type of the doped polysilicon used for the bit line is changed. Elimination of this problem allows fabrication of devices with high device packing densities.

Third, the formation of a stable titanium-silicide layer having a C54 structure, by heat treating at a temperature higher than a temperature used in a following capacitor formation process, and the further formation of a diffusion barrier, inhibits agglomeration of the titanium silicide, facilitating a reduction of the contact resistance of the bit line and a reduction of junction leakage from the source/drain regions.

Figure 7:
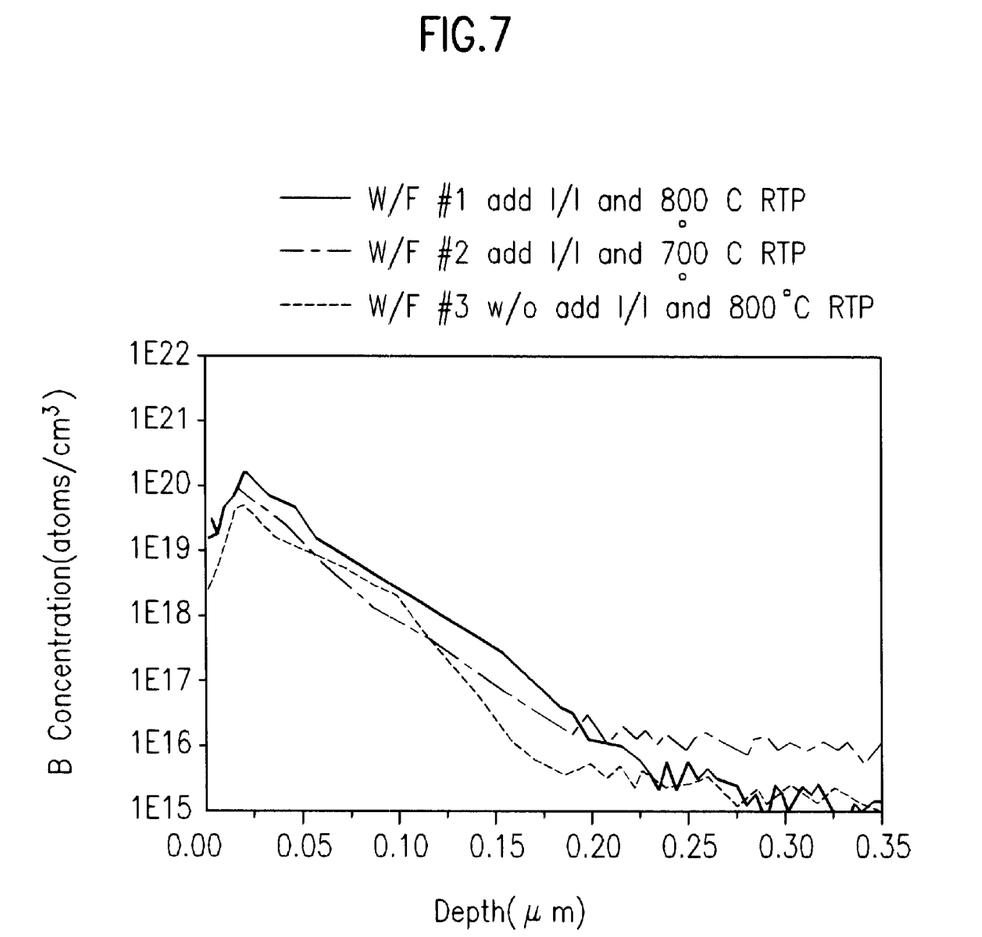
FIG. 7 illustrates SIMS (Secondary Ion Mass Spectroscopy) profiles in a p-type impurity region having a tungsten bit line formed therein according to additional ion injection and RTP heat treatment temperature.
Figure 8:
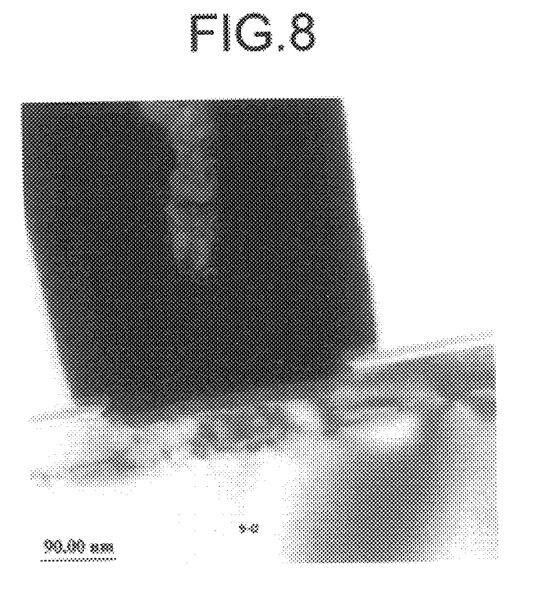
FIG. 8 illustrates a TEM (Transmission Electron Microscopy) photograph of a contact portion of the present invention; and, FIG. 9 illustrates a TEM photograph of a contact portion of the related art.
Figure 9:
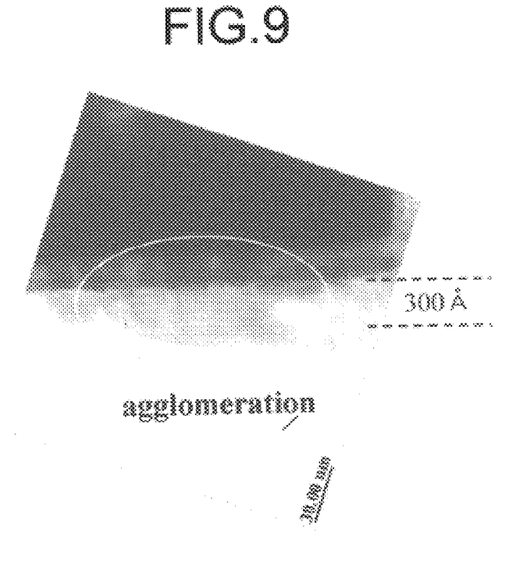

The foregoing advantages will be explained with reference to data obtained from experiments. FIG. 7 illustrates SIMS profiles in a p-type impurity region having a tungsten bit line formed therein according to additional ion injection and RTP heat treatment. FIG. 8 illustrates a TEM photograph of a contact portion of the present invention and FIG. 9 illustrates a TEM photograph of a contact portion of the related art.

In general, a contact resistance Rc can be expressed with the equation, below:

$$Rc(T) = H\exp\left(\frac{B(T)}{\sqrt{N}}\right) \quad (1)$$

where, H is a constant, B(T) denotes a work function dependent on tunneling effective mass and a barrier height, and N is an impurity dopant concentration. Therefore, it can be said that the contact resistance is dependent on the dopant concentration at a place where two materials make a contact and the barrier height influences the work function. When this is applied to the contact between the tungsten bit line and the silicon substrate, it is a key in dropping the contact resistance that the dopant concentration of the silicon substrate be made as high as possible and that the contact layer be formed of a metal having a good contact property to the tungsten bit line and a low barrier height to the silicon substrate Titanium silicide has been used as a contact layer in a contact region of metal and silicon for a long time because the titanium silicide has a very low barrier height to the silicon substrate while having a comparatively low resistivity, and an excellent contact with tungsten, aluminum or titanium nitride used for a diffusion barrier.

However, the titanium silicide layer is liable to agglomerate during heat treatments over 600° C., with a resultant reduction of the contact size. Therefore, in order to solve the problems caused by the bit line of tungsten, the present invention (1) improves the doping concentration in the contact region with the tungsten bit line by an additional injection of ions after formation of the bit line contact, (2) inhibits agglomeration even during heat treatment at an elevated temperature by forming titanium suicide having a C54 structure and (3) inhibits an out-diffusion of dopant present in the silicon substrate by improving the diffusion barrier performance using a double layer of titanium nitride, which is used as a diffusion barrier, thereby forming a tungsten bit line with a significantly low contact resistance regardless of the high temperature heat treatment done in a subsequent fabrication process.

Table 1 illustrates contact resistance data of specific tungsten bit lines of the present invention. As can be seen from table 1, wafers #1 and #2, in each of which dopant concentration is increased by an additional ion injection into a contact region in a p-type impurity region, exhibits a contact resistance significantly lower than wafers #3 and #4 where no impurity injection took place.

In the meantime, the great difference in contact resistances depending on the temperature of the RTP heat treatment conducted after formation of a contact layer of the tungsten bit line and the diffusion barrier illustrated in table 1 is analyzed with TEM for the contact regions in wafers #1 and #2. As can be verified from FIG. 9, in the case of the wafer #2, in which a titanium silicide having a C49 structure is formed by an RTP heat treatment at 700° C., the titanium silicide agglomerates in the subsequent high temperature heat treatment process, while, as can be verified from FIG. 8, in the case of the wafer #1 in which a titanium silicide having a C54 structure is formed by a RTP heat treatment at 800° C., the agglomeration is suppressed even in a subsequent high temperature heat treatment.

Accordingly, in the case of wafer #2 which is RTP heat treated at 700° C., it is understood that the titanium silicide agglomerates in the subsequent high temperature heat treatment, with a reduction of contact size and a consequent significant increase of contact resistance. It can also be seen that the contact resistance reduction is significant in a p-type impurity region and that the leakage current in an impurity region is small when titanium silicide having a C54 structure is formed by an additional ion injection and a high temperature heat treatment.

It will be apparent to those skilled in the art that various modifications and variations can be made in the method for forming a bit line of the present invention without departing from the spirit or scope of the invention. Thus, it is intended that the present invention cover the modifications and variations of this invention provided they come within the scope of the appended claims and their equivalents.

TABLE 1

Comparison of Contact Resistance (Rc) for different Fabrication Conditions

| wafer # | *1 | *2 | *3 | *4 | *5 | *6 | *7 | *8 |
|---|---|---|---|---|---|---|---|---|
| | | fabrication condition | | | contact size (0.32 μm) | | | |
| 1 | I/I YES | 800° C. 20 sec. | IMP TiN 250 | 285 | 788 | 11.3 | 0.54 | 800° C. 9 min. heat cycle |
| 2 | I/I YES | 700° C. 30 sec. | IMP TiN 250 | 289 | 2206 | 8.6 | 1.36 | 800° C. 9 min. heat cycle |
| 3 | I/I NO | 800° C. 20 sec. | IMP TiN 250 | 281 | 1242 | 11.4 | 0.86 | 800° C. 9 min. heat cycle |
| 4 | I/I NO | 700° C. 30 sec. | IMP TiN 250 | 293 | 2902 | 7.5 | 1.08 | 800° C. 9 min. heat cycle |

*1Additional ion injection
*2Ti/TiN heat treatment RTP conditions
*3Second diffusion barrier TiN conditions
*4n-type contact resistance
*5p-type contact resistance
*6Gate contact resistance
*7P$^+$ leakage current (fA/μm$^2$)
*8Followed heat treatment condition after formation of W-bit line.

This result can be verified from FIG. 7 which illustrates SIMS depth profiles on the wafers. It is shown that wafers #1 and #2, each having an increased dopant concentration in the silicon substrate by an additional injection, have a dopant concentration higher than wafer #3. Wafer #1, which is RTP heat treated at a higher temperature, is measured to have a higher dopant concentration in the silicon substrate than wafer #2 because the higher RTP heat treatment temperature stops the growth of grain boundaries of the titanium nitride layer used as a diffusion barrier, forming a denser titanium nitride layer TiN, that suppresses out-diffusion of dopant occurring in a subsequent heat treatment.

What is claimed is:

1. A method for forming a bit line, comprising the steps of:
providing a substrate having a cell source/drain impurity region and a peripheral source/drain impurity region, the peripheral source/drain impurity region being a p-type impurity region;
forming a doped polysilicon contact plug on the cell source/drain impurity region;
forming a first inter-layer insulating film on the substrate, said film having a first contact hole exposing at least a portion of the peripheral source/drain impurity region, and a second contact hole exposing at least a portion of said contact plug;

implanting additional p-type impurity ions into the exposed portion of the p-type impurity region to bolster the p+ ion concentration in case there is an out-diffusion of p+ ions from the p-type impurity region during subsequent steps in the fabrication process, while simultaneously implanting p-type impurity ions into the contact plug;

forming a titanium film in the first contact hole;

forming a titanium nitride film on the titanium film;

forming a titanium silicide extending below the surface of the substrate such that no agglomeration occurs; and forming a tungsten plug on the titanium nitride film in the first contact hole.

2. The method of claim 1, wherein the forming a titanium silicide step comprises conducting a heat treatment.

3. The method of claim 2, wherein the heat treatment is conducted at a temperature ranging 750~950° C. for 1~120 seconds in an RTP device.

4. The method of claim 3, wherein the heat treatment is conducted at a temperature ranging 650~850° C. for 0.3~60 minutes in a furnace.

5. The method of claim 1, wherein the titanium silicide has a C54 structure.

6. The method of claim 1, further comprising, after the forming titanium suicide step:

forming additional titanium nitride film on the titanium silicide.

7. The method of claim 1, wherein the forming a tungsten plug step further comprises:

forming a first tungsten layer, and patterning the first tungsten layer to leave the tungsten layer only in the first contact hole.

8. The method of claim 1, further comprising, after the forming a tungsten plug step:

forming a barrier layer and a second tungsten layer over the substrate;

selectively removing the barrier layer and the second tungsten layer to form a tungsten bit line; and, forming a cap layer and a protection layer over the substrate.

9. The method of claim 8, wherein the barrier layer is comprised of titanium nitride.

10. The method of claim 8, wherein the cap layer and protection layer are a nitride and an oxide, respectively.

11. The method of claim 1, further comprising:

forming a second inter-layer insulating film having a second contact hole to the tungsten plug, on the first inter-layer insulating film;

forming a barrier layer and a tungsten layer, in succession, over the substrate; and, selectively removing the barrier layer and the tungsten layer to leave the barrier layer and the tungsten layer only in the second contact hole.

12. The method of claim 11, wherein the impurity region below the first contact hole is a first impurity region and further comprises a second impurity region in the substrate below the second contact hole wherein a type of impurity in the first impurity region can be either n or p type regardless of the type of impurity in the second impurity region.

13. A method for forming a bit line, comprising the steps of:

providing a substrate having a cell source/drain impurity region and a peripheral source/drain impurity region;

forming a doped polysilicon contact plug on the cell source/drain impurity region;

forming a first inter-layer insulating film on the substrate, said film having a first contact hole exposing at least a portion of the peripheral source/drain impurity region, said impurity region being a p-type impurity region, and forming a second contact hole exposing at least a portion of said contact plug;

implanting additional p-type impurity ions into the exposed portion of the p-type impurity region, while simultaneously implanting p-type impurity ions into said contact plug;

forming a titanium film in the first contact hole;

forming a titanium nitride film on the titanium film;

forming a titanium silicide having a non-agglomerated portion extending below the surface of the substrate such that agglomeration of the silicide is prevented; and forming a tungsten plug on the titanium nitride film in the first contact hole.

14. The method of claim 13, wherein the forming titanium silicide by reacting the titanium film and the silicon substrate step comprises a heat treatment step.

15. The method of claim 14, wherein the heat treatment is conducted at a temperature ranging 750~950° C. for 1~120 seconds in an RTP device.

16. The method of claim 14, wherein the heat treatment is conducted at a temperature ranging 650~850° C. for 0.3~60 minutes in a furnace.

17. The method of claim 13, wherein the titanium silicide has a C54 structure.

18. The method of claim 13, further comprising, after the forming titanium silicide step:

depositing additional titanium nitride film on the titanium silicide.

19. The method of claim 13, wherein the forming a tungsten plug step further comprises:

depositing a first tungsten layer, and patterning the first tungsten layer to leave the tungsten layer only in the first contact hole by dry etching or using chemical mechanical polishing.

20. The method of claim 13, further comprising, after the forming a tungsten plug step:

depositing a barrier layer and a second tungsten layer over the substrate;

selectively removing the barrier layer and the second tungsten layer to form a tungsten bit line; and, depositing a cap layer and a protection layer over the substrate.

21. The method of claim 20, wherein the barrier layer is comprised of titanium nitride.

22. The method of claim 20, wherein the cap layer and protection layer are a nitride and an oxide, respectively.

23. The method of claim 13, further comprising:

forming a second inter-layer insulating film having a second contact hole to the tungsten plug, on the first inter-layer insulating film;

forming a barrier layer and a tungsten layer, in succession, over the substrate; and, selectively removing the barrier layer and the tungsten layer to leave the barrier layer and the tungsten layer only in the second contact hole.

24. The method of claim 23, wherein the impurity region below the first contact hole is a first impurity region and further comprises a second impurity region in the substrate below the second contact hole wherein a type of impurity in the first impurity region can be either n or p type regardless of the type of impurity in the second impurity region.

* * * * *